United States Patent
Shin et al.

(10) Patent No.: US 12,008,947 B2
(45) Date of Patent: Jun. 11, 2024

(54) PIXEL AND DISPLAY DEVICE INCLUDING THE SAME

(71) Applicant: SAMSUNG DISPLAY CO., LTD., Yongin-si (KR)

(72) Inventors: Kyoung Ju Shin, Yongin-si (KR); Hee Ju Ma, Yongin-si (KR); Sung Rak Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 13 days.

(21) Appl. No.: 18/053,485

(22) Filed: Nov. 8, 2022

(65) Prior Publication Data

US 2023/0145644 A1 May 11, 2023

(30) Foreign Application Priority Data

Nov. 10, 2021 (KR) .................. 10-2021-0154243

(51) Int. Cl.
*G09G 3/22* (2006.01)
*G06F 3/041* (2006.01)
(Continued)

(52) U.S. Cl.
CPC ........... *G09G 3/22* (2013.01); *G06F 3/04166* (2019.05); *G09G 3/32* (2013.01);
(Continued)

(58) Field of Classification Search
CPC .... G09G 3/22; G09G 3/32; G09G 2300/0426; G09G 2300/0819; G09G 2300/0852;
(Continued)

(56) References Cited

U.S. PATENT DOCUMENTS 9,202,410 B2 12/2015 Kim
10,789,890 B2 9/2020 Kang et al.
(Continued)

FOREIGN PATENT DOCUMENTS

KR 10-1984196 5/2019
KR 10-2019-0114458 10/2019
(Continued)

*Primary Examiner* — Amare Mengistu
*Assistant Examiner* — Gloryvid Figueroa-Gibson
(74) *Attorney, Agent, or Firm* — F. CHAU & ASSOCIATES, LLC

(57) ABSTRACT

A pixel includes a light emitting element, a first transistor connected to the light emitting element, a second transistor connected between a data line and a first electrode of the first transistor, a third transistor connected between a gate electrode of the first transistor T1 and a second electrode of the first transistor, a fourth transistor connected between a gate electrode of the first transistor and an initialization power source, and a storage capacitor connected between the first power source and the gate electrode of the first transistor. A voltage provided through the data line is time divided into a data voltage provided to the gate electrode of the first transistor when both the second and third transistors turn on, and an on-bias voltage provided to the first electrode of the first transistor when the second transistor turns on and the third transistor turns off.

20 Claims, 14 Drawing Sheets

(51) Int. Cl.
*G09G 3/32* (2016.01)
*H10K 59/40* (2023.01)

(52) U.S. Cl.
CPC ............. *G09G 2300/0426* (2013.01); *G09G 2300/0819* (2013.01); *G09G 2300/0852* (2013.01); *G09G 2310/0202* (2013.01); *G09G 2310/0267* (2013.01); *G09G 2310/027* (2013.01); *G09G 2310/08* (2013.01); *G09G 2320/0247* (2013.01); *G09G 2330/021* (2013.01); *H10K 59/40* (2023.02)

(58) Field of Classification Search
CPC ... G09G 2310/0202; G09G 2310/0267; G09G 2310/027; G09G 2310/08; G09G 2320/0247; G09G 2330/021; G06F 3/04166; H10K 59/40
USPC .......................................................... 345/212
See application file for complete search history.

(56) References Cited

U.S. PATENT DOCUMENTS

| | | |
|---|---|---|
| 10,908,758 B2 | 2/2021 | Rhe et al. |
| 11,114,033 B2 | 9/2021 | Park et al. |
| 2019/0295469 A1* | 9/2019 | Umezawa ............ G09G 3/3241 |
| 2020/0234641 A1* | 7/2020 | Jeong .................. G09G 3/3233 |
| 2021/0049965 A1 | 2/2021 | Jeon et al. |
| 2021/0174737 A1* | 6/2021 | Park ........................ G09G 3/20 |
| 2021/0295779 A1* | 9/2021 | Kim ..................... G09G 3/3291 |
| 2022/0284865 A1 | 9/2022 | Lee et al. |

FOREIGN PATENT DOCUMENTS

| | | |
|---|---|---|
| KR | 10-2020-0005695 | 1/2020 |
| KR | 10-2021-0011554 | 2/2021 |
| KR | 10-2021-0019635 | 2/2021 |
| KR | 10-2022-0126323 | 9/2022 |

\* cited by examiner

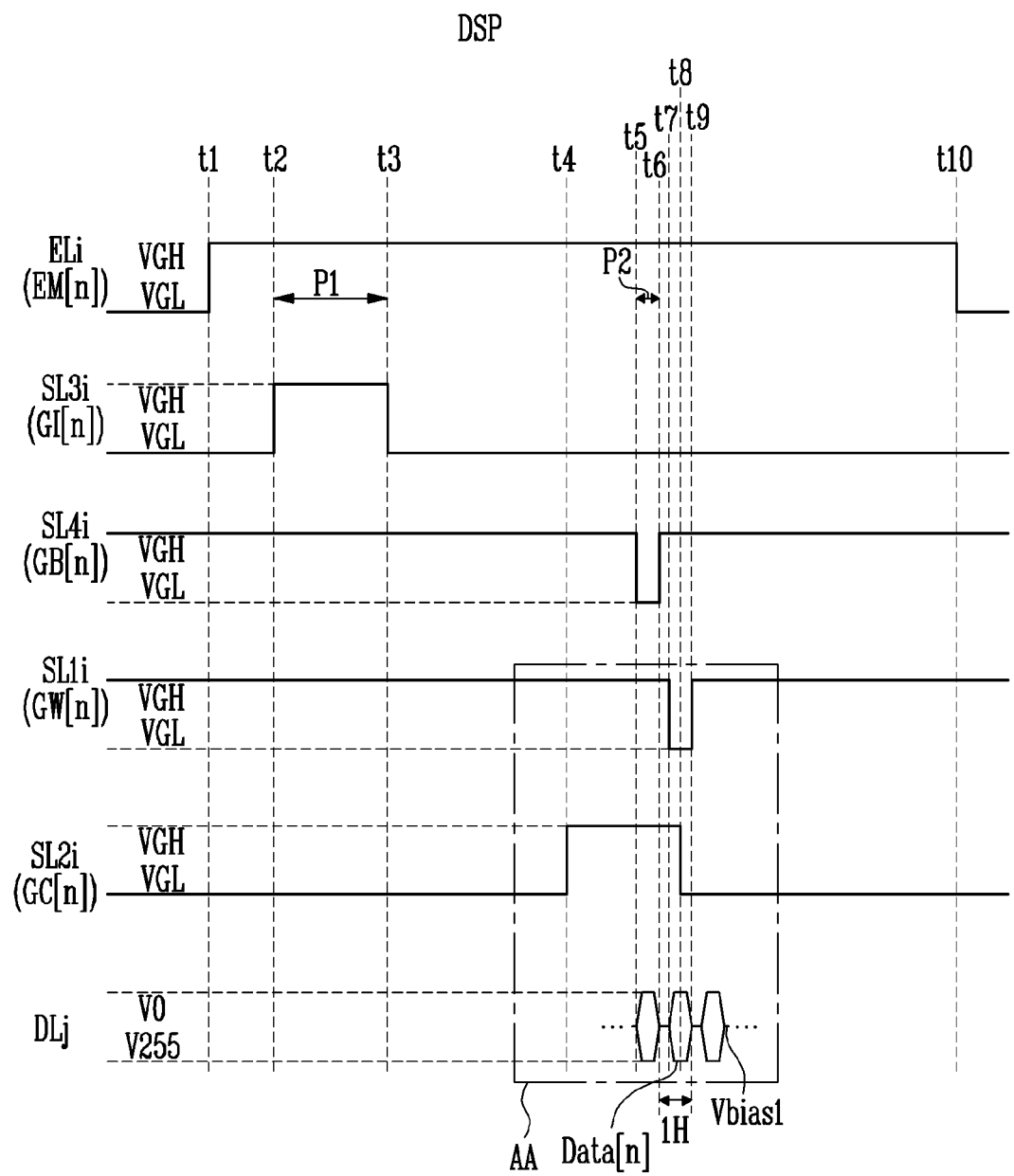

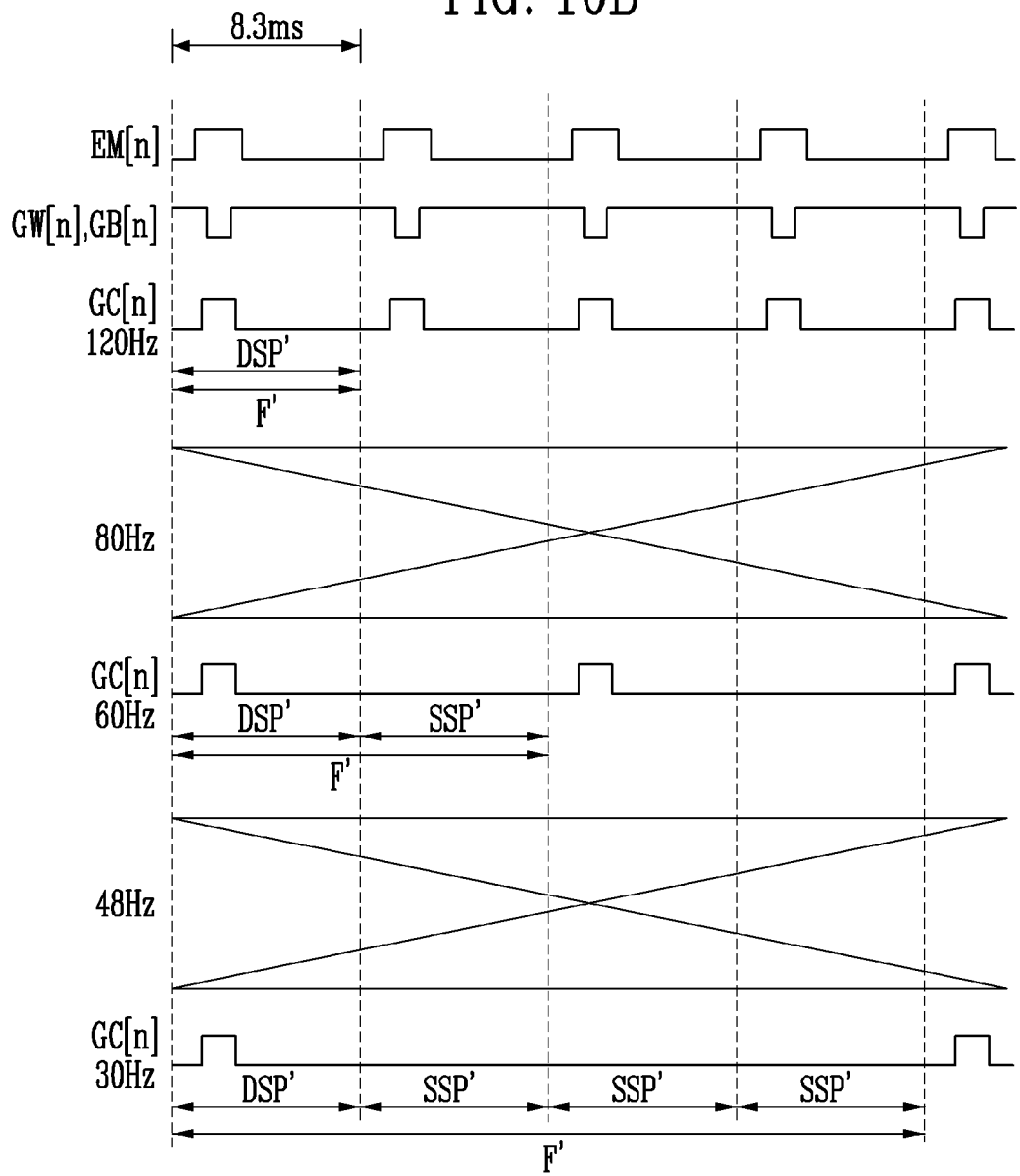

PIXEL AND DISPLAY DEVICE INCLUDING THE SAME

CROSS-REFERENCE TO RELATED APPLICATION

This application claims priority under 35 U.S.C. § 119 to Korean Patent Application No. 10-2021-0154243 filed in the Korean Intellectual Property Office on Nov. 10, 2021, the disclosure of which is incorporated by reference herein in its entirety.

1. Technical Field

The present disclosure relates to a pixel and a display device including the same.

2. Description of the Related Art

Electronic devices including portable terminals, digital cameras, notebook computers, navigation systems, and the like, which provide images to users, include a display device for displaying an image. A touch sensor for recognizing a touch input is applied to display devices included, for example, in portable terminals or tablet PCs. The touch sensor tends to substitute for a keypad, for example, as the existing physical input devices because of its convenience.

A display device may operate at a variable driving frequency. The display device may include a display scan period and at least one self-scan period during one frame period. An on-bias voltage may be provided to a driving transistor so as to prevent a flicker phenomenon which may occur when a driving frequency varies.

In the display device, when an external input (e.g., a touch of a user) occurs during the self-scan period, the self-scan period may be changed to the display scan period. A time taken when the self-scan period is changed to the display scan period due to an external input during the self-scan period may be defined as latency.

According to a tendency to implement a display device with a high resolution, research for decreasing latency while not increasing the number of transistors included in a pixel has recently been conducted.

SUMMARY

Embodiments provide a pixel having decreased latency and a display device including the pixel.

In accordance with an aspect of the present disclosure, a pixel includes a light emitting element; a first transistor connected between a first power source and the light emitting element; a second transistor connected between a data line and a first electrode of the first transistor, the second transistor including a gate electrode connected to a first scan line; a third transistor connected between a gate electrode of the first transistor T1 and a second electrode of the first transistor, the third transistor including a gate electrode connected to a second scan line; a fourth transistor connected between the gate electrode of the first transistor and an initialization power source, the fourth transistor including a gate electrode connected to a third scan line; and a storage capacitor connected between the first power source and the gate electrode of the first transistor.

A voltage provided through the data line is time divided into a data voltage provided to the gate electrode of the first transistor when both the second transistor and the third transistor are turned on, and an on-bias voltage provided to the first electrode of the first transistor when the second transistor is turned on and the third transistor is turned off.

The voltage provided through the data line may be repeatedly changed from the data voltage to the on-bias voltage in a time unit.

The time unit may be one horizontal cycle.

The data voltage may have a plurality of voltage levels corresponding to a plurality of grayscale values, and the on-bias voltage may be a constant voltage.

The pixel may further include: a fifth transistor connected between the first power source and the first electrode of the first transistor; a sixth transistor connected between the second electrode of the first transistor and an anode of the light emitting element; and a seventh transistor connected between an anode initialization power source and the anode of the light emitting element.

The second transistor may be turned on by a first scan signal, the third transistor may be turned on by a second scan signal, the fourth transistor may be turned on by a third scan signal, the fifth transistor may be turned off by an emission control signal, the sixth transistor may be turned off by the emission control signal, and the seventh transistor may be turned on by a fourth scan signal.

The second scan signal and the third scan signal may be output at a frequency equal to an image refresh rate.

The first scan signal, the fourth scan signal, and the emission control signal may be output at a frequency different from an image refresh rate that is equal to or smaller than a reference refresh rate.

The frequency may be output twice of the reference refresh rate.

The reference refresh rate may be 120 Hz.

The third scan signal may be supplied before the first scan signal and the second scan signal are supplied, and a falling edge of the second scan signal may overlap a supply period of the first scan signal.

The first scan signal may be a signal shifted by one horizontal cycle from the fourth scan signal.

Each of the third transistor and the fourth transistor may be an N-type transistor.

The pixel may further include a boost capacitor between the gate electrode and one end of the storage capacitor.

The first transistor may further include a bottom metal electrode connected to the first power source.

In accordance with an aspect of the present disclosure, a display device includes: a display panel including a pixel connected to a data line, the display panel operating at a variable driving frequency; and a touch sensor disposed on the display panel. One frame period includes one display scan period and at least one self-scan period. The display panel operates in the display scan period when a touch input is sensed through the touch sensor during the self-scan period. A voltage provided through the data line is repeatedly changed from a data voltage to a first on-bias voltage in a time unit during the display scan period.

The data voltage may have a plurality of voltage levels corresponding to a plurality of grayscale values, and the first on-bias voltage may be a constant voltage.

The voltage provided through the data line may be a second on-bias voltage different from the first on-bias voltage during the self-scan period.

The pixel may include: a light emitting element; a first transistor connected between a first power source and the light emitting element; a second transistor connected between the data line and a first electrode of the first transistor, the second transistor including a gate electrode connected to a first scan line; a third transistor connected between a gate electrode of the first transistor T1 and a second electrode of the first transistor, the third transistor including a gate electrode connected to a second scan line; a fourth transistor connected between the gate electrode of the first transistor and an initialization power source, the fourth transistor including a gate electrode connected to a third scan line; and a storage capacitor connected between the first power source and the gate electrode of the first transistor.

In the display scan period, the data voltage may be provided to the gate electrode of the first transistor when both the second transistor and the third transistor are turned on, and the first on-bias voltage may be provided to the first electrode of the first transistor when the second transistor is turned on and the third transistor is turned off.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7A is a waveform diagram illustrating a display scan period in accordance with an embodiment of the present invention.

FIGS. 10A and 10B are diagrams illustrating an effect of a pixel driving method in accordance with an embodiment of the present invention.

DETAILED DESCRIPTION OF THE EMBODIMENTS

Figure 1:
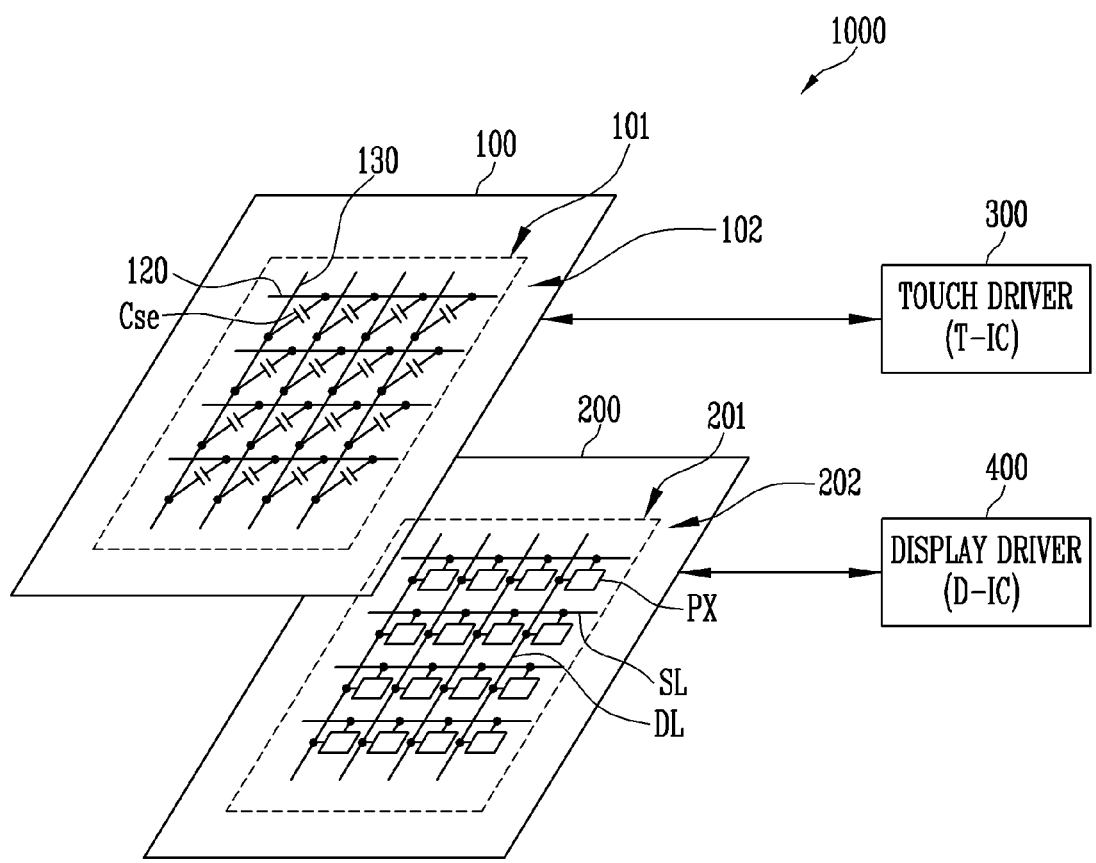
FIG. 1 illustrates a display device in accordance with an embodiment of the present invention.

The present disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

Hereinafter, exemplary embodiments of the present disclosure will be described in more detail with reference to the accompanying drawings.

Figure 2:
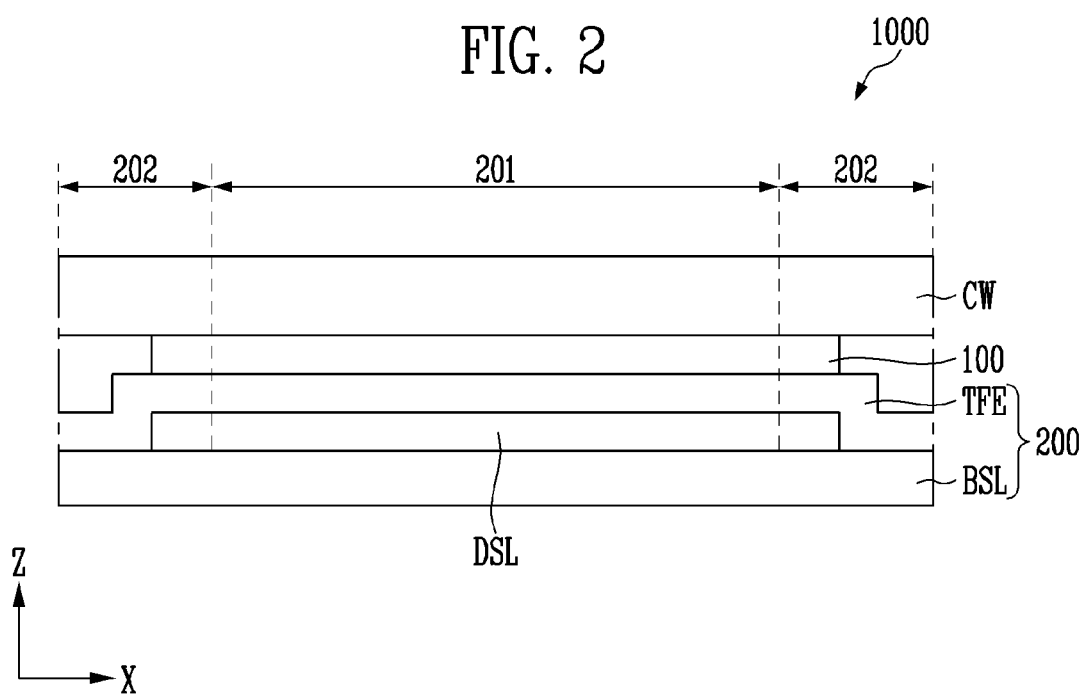
FIG. 2 is a schematic partial sectional view of the display device shown in FIG. 1 in accordance with an embodiment of the present invention.
Figure 3:
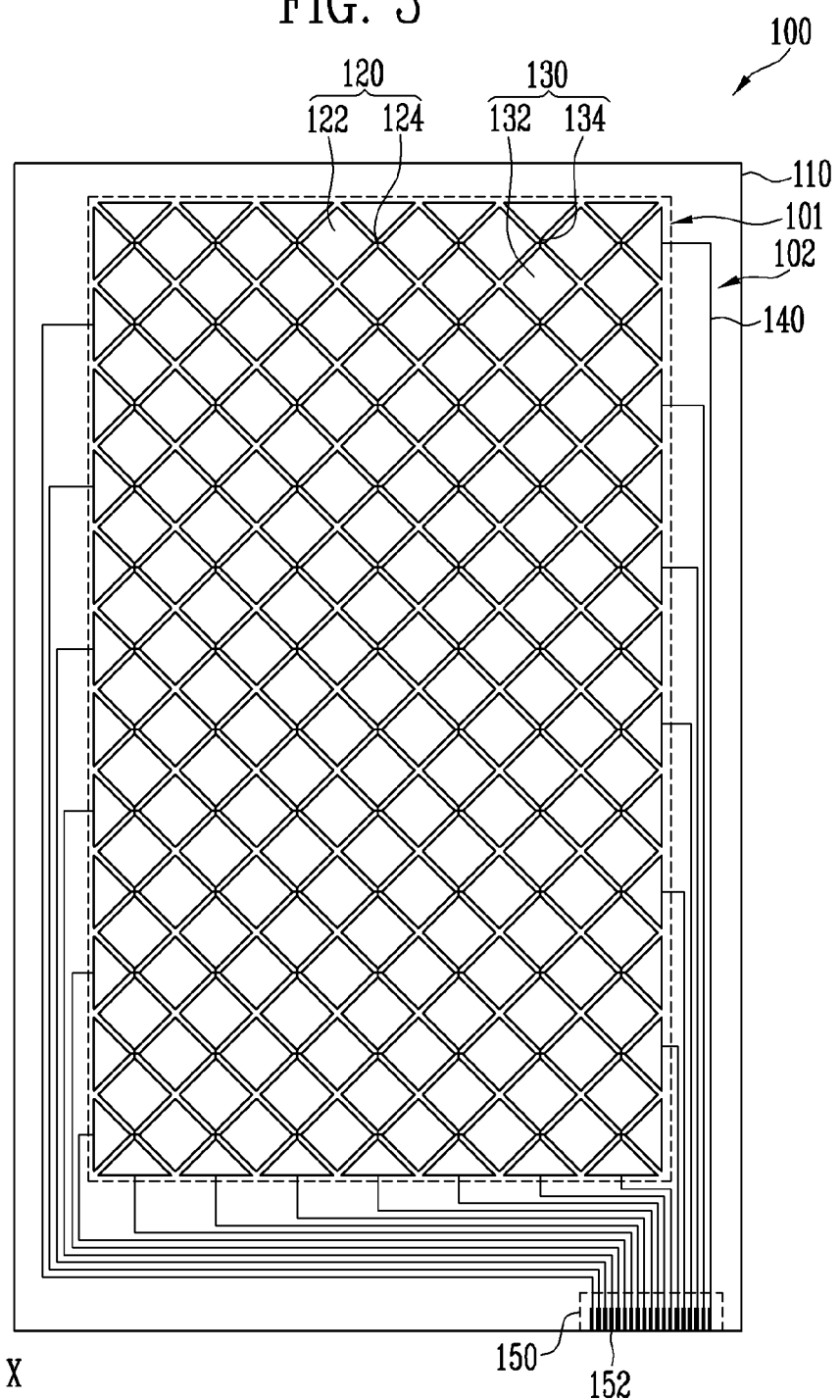
FIG. 3 illustrates a sensor unit of a touch sensor in accordance with an embodiment of the present invention.
Figure 4:
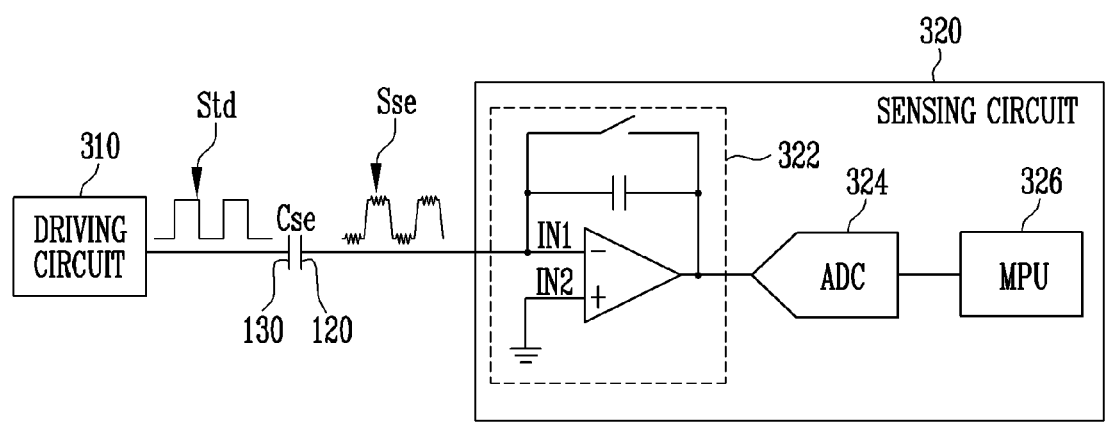
FIG. 4 is a diagram illustrating a method of driving the touch sensor in accordance with an embodiment of the present invention.

FIG. 1 illustrates a display device in accordance with an embodiment of the present invention. FIG. 2 is a schematic partial sectional view of the display device shown in FIG. 1. FIG. 3 illustrates a sensor unit of a touch sensor in accordance with an embodiment of the present invention. FIG. 4 is a diagram illustrating a method of driving the touch sensor in accordance with an embodiment of the present invention.

Referring to FIG. 1, the display device 1000 in accordance with the embodiment of the present invention may include a sensor unit 100, a display panel 200, a touch driver 300, and a display driver 400. The sensor unit 100 and the touch driver 300 may constitute a touch sensor.

In accordance with an embodiment of the present invention, the display device 1000 may be applied to a portable terminal. Although not separately shown, the display device 1000 may be disposed in a bracket/case or the like together with an electronic module, a camera module, a power module, and the like, which are mounted on a main board, to constitute the portable terminal. However, the display device 1000 is not limitedly applied thereto. For example, the display device 1000 may be applied to medium-/small-sized electronic devices such as tablet PCs, vehicle navigation systems, game consoles, and smart watches, including large-sized electronic devices such as televisions and monitors.

In the embodiment of FIG. 1, a case where the sensor unit 100 and the display panel 200 are separated from each other is illustrated in the embodiment of FIG. 1A, the present invention is not limited thereto. For example, the sensor unit 100 and the display panel 200 may be integrally manufactured.

In some embodiments, the sensor unit 100 may be provided on at least one surface of the display panel 200. For example, the sensor unit 100 may be disposed on one surface (e.g., an upper surface) of both surfaces of the display panel 200 in a direction in which an image is displayed. In some embodiments, the sensor unit 100 may be formed directly on at least one surface of both the surfaces of the display panel 200 or may be formed inside the display panel 200. For example, the sensor unit 100 may be formed directly on an outer surface of an upper substrate or a lower substrate of the display panel (e.g., an upper surface of the upper substrate or a lower surface of the lower substrate), or may be formed directly on an inner surface of the upper substrate or the lower substrate (e.g., a lower surface of the upper substrate or an upper surface of the lower substrate).

The sensor unit 100 may include a touch active area 101 capable of sensing an external input (e.g., a touch of a user) and a touch non-active area 102 disposed outside the touch active area 101. In some embodiments, the touch active area 101 may be disposed to correspond to a display area 201 of the display panel 200.

In some embodiments, at least one area of the sensor unit 100 may be disposed to overlap the display panel 200. For example, at least one area, e.g., the touch active area 101 of the sensor unit 100, may be disposed on one area, e.g., the display area 201 of the display panel 200. In some embodiments, at least one electrode, e.g., a first electrode 120 and a second electrode 130, which are used to detect a touch input, may be disposed in the touch active area 101. For example, the first electrode 120 and the second electrode 130 may be provided on the display area 201 of the display panel 200.

Lines for electrically connecting the at least one electrode, e.g., the first and second electrodes 120 and 130, which are provided in the touch active area 101, to the touch driver 300 may be disposed in the touch non-active area 102. In some embodiments, the touch non-active area 102 may be disposed to correspond to a non-display area 202 of the display panel 200.

In some embodiments, the sensor unit 100 may include at least one first electrode 120 and at least one second electrode 130, which are provided in the touch active area 101. The sensor unit 100 may include a plurality of first electrodes 120 and a plurality of second electrodes 130 intersecting the first electrodes 120. In some embodiments, the first electrodes 120 may extend along a straight line extending in a first direction, and the second electrodes 130 may extend along a straight line extending in a second direction intersecting the first direction while being insulated from the first electrodes 120 by an insulating layer (not shown). A capacitance Cse may be formed between the first electrodes 120 and the second electrodes 130, particularly, at an intersection portion of the first electrodes 120 and the second electrodes 130. The capacitance Cse is changed when a touch input occurs at a corresponding spot or the periphery thereof. Thus, using detection of a change in the capacitance Cse, the touch input can be sensed.

The shape, size, and/or arrangement direction of the first electrodes 120 and the second electrodes 130 are not particularly limited. In an unlimited embodiment related to this, the first electrodes 120 and the second electrodes 130 may be configured as shown in FIG. 3.

Referring to FIG. 3, the sensor unit 100 may include a touch substrate 110 on which the touch active area 101 and the touch non-active area 102 are defined, first electrodes 120 and second electrodes 130, which are provided in the touch active area 101 on the touch substrate 110, and lines 140 and a pad part 150, which are provided in the touch non-active area 102 on the touch substrate 110.

The touch substrate 110 is a substrate which is a base of the sensor unit 100, and may be a rigid substrate or a flexible substrate. For example, the touch substrate 110 may be a rigid substrate made of glass or tempered glass, or a flexible substrate configured with a thin film made of flexible plastic. In some embodiments, the touch substrate 110 may be omitted. For example, when the first and second electrodes 120 and 130 are formed directly on at least one substrate constituting the display panel 200, the touch substrate 110 for constituting the sensor unit 100 may be replaced with at least one substrate constituting the display panel 200, a thin film encapsulation layer TFE (see FIG. 2), or the like.

The first electrodes 120 may extend along a straight line extending in the first direction, e.g., an X direction. In some embodiments, each of first electrodes 120 disposed on each row may include a plurality of first sensing cells 122 and first connection parts 124 electrically connecting first sensing cells 122 of each row along the first direction. In some embodiments, the first connection parts 124 may be integrally configured with the first sensing cells 122, or may be configured in a bridge-shaped connection pattern. The first electrodes 120 may correspond to a driving electrode (Tx electrode) which is supplied with a touch driving signal for touch driving and/or a sensing electrode (Rx electrode) which outputs a touch sensing signal corresponding to the touch driving signal input to the driving electrode. In some embodiments, when the sensor unit 100 is a mutual capacitive type touch sensor, the first electrodes 120 may be implemented as sensing electrodes.

The second electrodes 130 may extend along a straight line extending in the second direction, e.g., a Y direction. In some embodiments, each of second electrodes 130 disposed on each column may include a plurality of second sensing cells 132 and second connection parts 134 electrically connecting second sensing cells 132 with each other in each column in the second direction. In some embodiments, the second connection parts 134 may be integrally configured with the second sensing cells 132, or may be configured in a bridge-shaped connection pattern. The second electrodes 130 may correspond to a driving electrode which is supplied with a touch driving signal for touch driving and/or a sensing electrode which outputs a touch sensing signal corresponding to the touch driving signal input to the driving electrode. In some embodiments, the sensor unit 100 is a mutual capacitive type touch sensor, the first electrodes 120 may be sensing electrodes, and the second electrodes 130 may be driving electrodes.

The lines 140 connect the first electrodes 120 and the second electrodes 130 to the pad part 150. For example, each line 140 may electrically connect a corresponding first electrode 120 or a corresponding second electrode 130 to a corresponding pad of a plurality of pads 152 provided in the pad part 150.

The pad part 150 may include the plurality of pads 152 for connecting the first and second electrodes 120 and 130 to an external driving circuit, e.g., the touch driver 300. Signal transmission and/or power supply may be made between the sensor unit 100 and the touch driver 300 through the pad part 150.

Referring to FIGS. 1 and 2, the display panel 200 includes the display area 201 and the non-display area 202 at the outside of the display area 201.

The display panel 200 may include a base substrate BSL, an element layer DSL located on the base substrate BSL, and the thin film encapsulation layer TFE located on the element layer DSL.

The base substrate BSL is a substrate supporting the element layer DSL. In some embodiments, the base substrate BSL may be an insulating substrate made of glass, quartz, ceramic, or plastic.

The element layer DSL may be located on the base substrate BSL. In some embodiments, the element layer DSL may include a plurality of pixels PX and a plurality of display signal lines, which are located on the base substrate BSL. Each pixel PX may include a thin film transistor TFT, a capacitor, and a light emitting element. The plurality of signal lines may include a plurality of scan lines SL for transferring a scan signal to each pixel PX and a plurality of data lines DL for transferring a data signal to each pixel PX. The pixels PX which the element layer DSL includes may be located in the display area 201.

The element layer DSL may further include elements and lines, which are located on the base substrate BSL and are located in the display area 201. The elements and lines may generate various signals applied to the pixel PX or transfer signals to the pixels PX.

The thin film encapsulation layer TFE may be located on the element layer DSL. The thin film encapsulation layer TFE may protect the element layer DSL. The thin film encapsulation layer TFE may include a plurality of thin films.

A cover window CW may be disposed on the top of the sensor unit 100. The cover window CW is disposed on the display panel 200, and protects the display panel 200 from an external impact or the like. The cover window CW may be implemented with a film made of a transparent material, e.g., tempered glass or plastic. Although not shown in the drawings, the display device 1000 may further include an optical member.

Referring to FIG. 4, the touch driver 300 may include a driving circuit 310 and a sensing circuit 320. A capacitance Cse is formed at an intersection portion of a first electrode 120 and a second electrode 130. The second electrode 130 is supplied with a touch driving signal Std from a driving circuit 310 provided in the touch driver 300. Then, a touch sensing signal Sse corresponding to the touch driving signal Std is output from the first electrode 120 due to a coupling effect of the capacitance Cse. The touch sensing signal Sse is input to a sensing circuit 320 provided in the touch driver 300. The sensing circuit 320 amplifies, converts, and signal-processes the touch sensing signal Sse input from each first electrode 120, and detects a touch input, based on a result obtained by amplifying, converting, and signal processing the touch sensing signal Sse.

In some embodiments, the sensing circuit 320 may include a signal receiver 322, an Analog Digital Converter (hereinafter, abbreviated as 'ADC') 324, and a signal processor 326.

The signal receiver 322 receives a touch sensing signal Sse from each first electrode 120. The signal receiver 322 may amplify and output the touch sensing signal Sse. In some embodiments, the signal receiver 322 may be implemented as an Analog Front End (hereinafter, abbreviated as 'AFE') including at least an Operational Amplifier (OP amp). In some embodiments, a first input terminal IN1 of the signal receiver 322, e.g., an inverting input terminal of the OP amp, may be electrically connected to each first electrode 120. For example, the touch sensing signal Sse from the first electrode 120 may be input to the first input terminal IN1. A second input terminal IN2 of the signal receiver 322, e.g., a non-inverting input terminal of the OP amp, may be electrically connected to a ground (hereinafter, abbreviated as 'GND') terminal. For example, a GND voltage may be input to the second input terminal IN2.

The ADC 324 converts an analog signal input from the signal receiver 322 into a digital signal. In some embodiments, the ADC 324 may be provided as many as the number of first electrodes 120 so as to correspond one-to-one to sensing channels. For example, each ADC 324 may be connected to a corresponding first electrode of the first electrodes 120. In some embodiments, the ADC 324 may be configured such that a plurality of first electrodes 120 share one ADC 324. A switching circuit may be additionally provided between the signal receiver 322 and the ADC 324.

The signal processor 326 signal-processes the converted signal (digital signal) from the ADC 324, and detects a touch input, based on a result obtained by signal-processing the converted signal. In some embodiments, the signal processor 326 may detect whether a touch input has occurred and a position of the touch input by synthetically analyzing a signal input via the signal receiver 322 and the ADC 324 from a plurality of first electrodes 120 (i.e., an amplified and converted touch sensing signal Sse). In some embodiments, the signal processor 326 may be implemented as a microprocessor (hereinafter, abbreviated as 'MPU'). A memory necessary for driving of the signal processor 325 may be provided inside the sensing circuit 320. The configuration of the signal processor 326 is not limited thereto. In some embodiments, the signal processor 326 may be implemented as a microcontroller (MCU) or the like.

Figure 5:
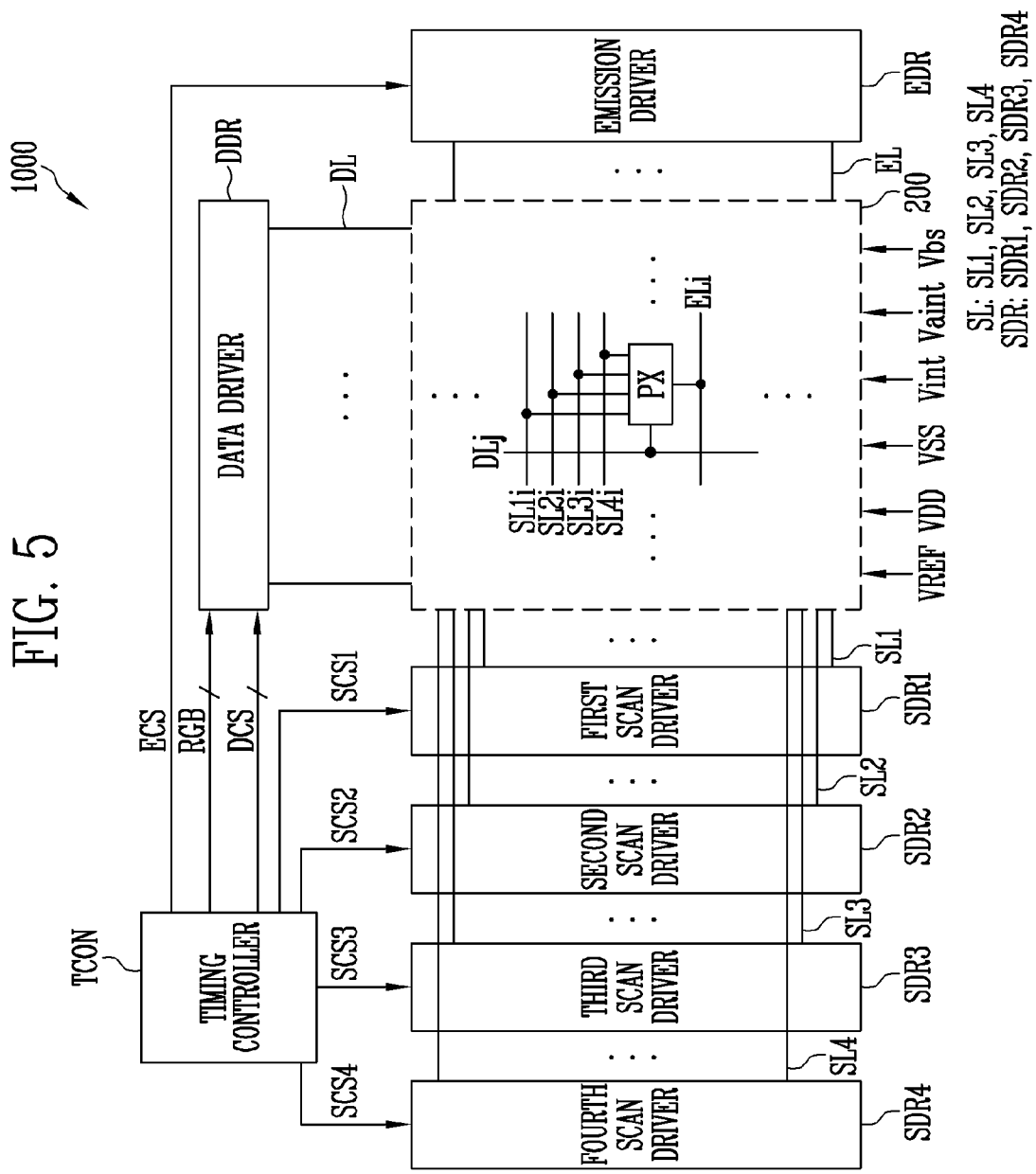
FIG. 5 is a block diagram illustrating a display panel and a display driver in accordance with an embodiment of the present invention.

FIG. 5 is a block diagram illustrating a display panel and a display driver in accordance with an embodiment of the present invention.

Referring to FIGS. 1 and 5, in accordance with an embodiment, a plurality of scan lines SL, a plurality of data lines DL, and a plurality of pixels PX connected to the scan lines SL and the data lines DL may be provided in the display area 210. Various driving signals for driving the pixels PX and/or lines for supplying power may be provided in the non-display area 202.

In the present invention, the kind of the display panel 200 is not particularly limited. For example, the display panel 200 may be a self-luminescent display panel. The display panel 200 may include a plurality of light emitting elements. For example, the light emitting element may be selected as an organic light emitting diode. The light emitting element may be selected as an inorganic light emitting diode such as a micro LED (light emitting diode) or a quantum dot light emitting diode. The light emitting element may be an element configured with a combination of organic and inorganic materials.

The display driver 400 may be electrically connected to the display panel 200 to be supplied with a signal necessary for driving of the display panel 200. In accordance with an embodiment, the display driver 400 may include a scan driver SDR which supplies scan signals to the scan lines SL, a data driver DDR which supplies data signals to the data lines DL, and a timing controller TCON which supplies various control signals for driving the scan driver SDR and the data driver DDR and/or image data.

The scan driver SDR may include a first scan driver SDR1, a second scan driver SDR2, a third scan driver SDR3, and a fourth scan driver SDR4. The present invention is not limited thereto. In some embodiments, at least some of scan drivers may be integrated as one driving circuit, one module, or the like according to a design.

In some embodiments, the display device 1000 may further include a power supply (not shown) to supply, to the display panel 200, a voltage of a first power source VDD, a voltage of a second power source VSS, a voltage of a third power source Vint (or initialization power source), and a voltage of a fourth power source Vaint (or anode initialization power source). The power supply may supply, to the scan driver SDR and/or an emission driver EDR, a low power source (VGL shown in FIG. 7A) and a high power source (VGH shown in FIG. 7A), which determine a gate-on level and a gate-off level of a scan signal, a control signal, and/or an emission control signal. The low power source may have a voltage level lower than a voltage level of the high power source. However, this is merely illustrative, and at least one of the first power source VDD, the second power source VSS, the third power source Vint (or initialization power source), the fourth power source Vaint (or anode initialization power source), the low power source, and the high power source may be supplied from the timing controller TCON or the data driver DDR.

In some embodiments, the first power source VDD and the second power source VSS may generate voltages for driving a light emitting element. In some embodiments, a voltage level of the second power source VSS may be lower than a voltage level of the first power source VDD. For example, the voltage of the first power source VDD may be a positive voltage, and the voltage of the second power source VSS may be a negative voltage.

The initialization power source Vint may be a power source for initializing the pixel PX. For example, a capacitor and/or a transistor, included in the pixel PX, may be initialized by the voltage of the initialization power source Vint. The initialization power source Vint may be a positive voltage.

The anode initialization power source Vaint may be a voltage for initializing the pixel PX. For example, an anode of a light emitting element included in the pixel PX may be initialized by the voltage of the anode initialization power source Vaint. The anode initialization power source Vaint may be a negative voltage.

The display device 1000 may display an image at various image refresh rates (e.g., driving frequencies, or screen refresh rates) according to a driving condition. The image refresh rate is a frequency at which a data signal is substantially written to a driving transistor of the pixel PX. For example, the image refresh rate is referred to as a screen scan rate or a screen refresh frequency, and represents a frequency at which a display screen is refreshed for a unit time such as a second.

In some embodiments, an output frequency of the data driver DDR with respect to one horizontal line (or pixel row) and/or an output frequency of the first scan driver DDR which outputs a write scan signal may be determined corresponding to the image refresh rate. For example, a refresh rate for driving a moving image may be a frequency of about 60 Hz or higher (e.g., 120 Hz).

In some embodiments, the display device 1000 may adjust an output frequency of the scan driver SDR with respect to one horizontal line (or pixel row) and an output frequency of the data driver DDR, which corresponds thereto, according to a driving condition. For example, the display device 1000 may display an image, corresponding to various image refresh rates of 1 Hz to 120 Hz. However, this is merely illustrative, and the display device 1000 may display an image even at an image refresh rate of 120 Hz (e.g., 240 Hz or 480 Hz).

The display panel 200 may include pixels PX respectively connected to data lines DL, scan lines SL1, SL2, SL3, and SL4, and emission control lines EL. The pixels PX may be supplied with the voltages of the first power source VDD, the second power source VSS, the initialization power source Vint, and the anode initialization power source Vaint. In some embodiments, a pixel PX disposed on an ith row and a jth column (i and j are natural numbers) may be connected to scan lines SL1$i$, SL2$i$, SL3$i$, and SL4$i$ corresponding to an ith pixel row, an emission control line EL$i$ corresponding to the ith pixel row, and a data line DL$j$ corresponding to an ith pixel column.

In some embodiments of the present invention, signal lines SL1, SL2, SL3, SL4, EL, and DL connected to a pixel PX may be variously set corresponding to a circuit structure of the pixel PX.

The timing controller TCON may generate a first driving control signal SCS1, a second driving control signal SCS2, a third driving control signal SCS3, a fourth driving control signal SCS4, a fifth driving control signal ECS, and a sixth driving control signal DCS, corresponding to synchronization signals supplied from the outside. The first driving control signal SCS1 may be supplied to the first scan driver SDR1, the second driving control signal SCS2 may be supplied to the second scan driver SDR2, the third driving control signal SCS3 may be supplied to the third scan driver SDR3, a fourth driving control signal SCS4 may be supplied to the fourth scan driver SDR4, a fifth driving control signal ECS may be supplied to the emission driver EDR, and a sixth driving control signal DCS may be supplied to the data driver DDR. The timing controller TCON may align input image data supplied from the outside into image data RGB and supply the image data RGB to the data driver DDR.

A first scan start pulse and clock signals may be included in the first driving control signal SCS1. The first scan start pulse may control a first timing of a scan signal output from the first scan driver SDR1. The clock signals may be used to shift the first scan start pulse.

A second scan start pulse and clock signals may be included in the second driving control signal SCS2. The second scan start pulse may control a first timing of a scan signal output from the second scan driver SDR2. The clock signals may be used to shift the second scan start pulse.

A third scan start pulse and clock signals may be included in the third driving control signal SCS3. The third scan start pulse may control a first timing of a scan signal output from the third scan driver SDR3. The clock signals may be used to shift the third scan start pulse.

A fourth scan start pulse and clock signals may be included in the fourth driving control signal SCS4. The fourth scan start pulse may control a first timing of a scan signal output from the fourth scan driver SDR4. The clock signals may be used to shift the fourth scan start pulse.

An emission control start pulse and clock signals may be included in the fifth driving control signal ECS. The emission control start pulse may control a first timing of an emission control signal output from the emission driver EDR. The clock signals may be used to shift the emission control start pulse.

A source start pulse and clock signals may be included in the sixth driving control signal DCS. The source start pulse may control a sampling start time of data. The clock signals may be used to control a sampling operation.

The first scan driver SDR1 may receive the first driving control signal SCS1 from the timing controller TCON, and supply a scan signal (e.g., a first scan signal) to first scan lines SL1, based on the first driving control signal SCS1. For example, the first scan driver SDR1 may sequentially supply the first scan signal to the first scan lines SL1. When the first scan signal is sequentially supplied, the pixels PX may be selected in units of horizontal lines (or units of pixel rows), and a data signal (Data[n] shown in FIG. 7A) and an on-bias power source (Vbias1 shown in FIG. 7A and Vbias2 shown in FIG. 8) may be alternately supplied to the pixels PX. For example, the first scan signal may be a signal used for data writing and the on-bias power source. The on-bias power source may be a power source for supplying a predetermined on-bias voltage to a source electrode of a driving transistor included in the pixel PX.

The first scan signal may be set to a gate-on level (e.g., a low voltage). A transistor which is included in the pixel PX and receives the first scan signal may be set to a turn-on state when the first scan signal is supplied.

The first scan driver SDR1 may supply a scan signal to first scan lines SL1 in a display scan period (DSP shown in FIG. 7A) of one frame. In some embodiments, the first scan driver SDR1 may supply at least one scan signal to each of the first scan lines SL1 during the display scan period.

The second scan driver SDR2 may receive the second driving control signal SCS2 from the timing controller TCON, and supply a scan signal (e.g., a second scan signal) to second scan lines SL2, based on the second driving control signal SCS2. For example, the second scan driver SDR2 may sequentially supply the second scan signal to the second scan lines SL2.

The second scan signal may be supplied to compensate for a threshold voltage of a transistor included in each of the pixels PX. When the second scan signal is supplied, each of the pixels PX may perform a threshold voltage compensation operation of a driving transistor. The second scan signal may be set to a gate-on level (e.g., a high voltage). A transistor which is included in the pixel PX and receives the second scan signal may be set to the turn-on state when the second scan signal is supplied.

The second scan driver SDR2 may supply a scan signal to the second scan lines SL2 during the display scan period of the one frame. In some embodiments, the second scan driver SDR2 may supply at least one scan signal to each of the second scan lines SL2 during the display scan period.

The third scan driver SDR3 may receive the third driving control signal SCS3 from the timing controller TCON, and supply a scan signal (e.g., a third scan signal) to third scan lines SL3, based on the third driving control signal SCS3. For example, the third scan driver SDR3 may sequentially supply the third scan signal to the third scan lines SL3.

The third scan signal may be supplied to initialize a transistor and a capacitor, which are included in each of the pixels PX. When the third scan signal is supplied, each of the pixels PX may perform an initialization operation. The third scan signal may be set to the gate-on level (e.g., the high voltage). A transistor which is included in the pixel PX and receive the third scan signal may be set to the turn-on state when the third scan signal is supplied.

The fourth scan driver SDR4 may receive the fourth driving control signal SCS4 from the timing controller TCON, and supply a scan signal (e.g., a fourth scan signal) to fourth scan lines SL4, based on the fourth driving control signal SCS4. For example, the fourth scan driver SDR4 may sequentially supply the fourth scan signal to the fourth scan lines SL4. The fourth scan signal may be supplied to initialize a light emitting element included in each of the pixels PX. When the fourth scan signal is supplied, each of the pixels PX may perform an initialization operation of the light emitting element.

The fourth scan signal may be set to the gate-on level (e.g., the low voltage). A transistor which is included in the pixel PX and receives the fourth scan signal may be set to the turn-on state when the fourth scan signal is supplied.

The emission driver EDR may receive the fifth driving control signal ECS from the timing controller TCON, and supply an emission control signal to the emission control lines EL, based on the fifth driving control signal ECS. For example, the emission driver EDR may sequentially supply the emission control signal to the emission control lines EL.

When the emission control signal is supplied, the pixels PX do not emit light in units of horizontal lines (or units of pixel rows). To this end, the emission control signal may be set to a gate-off level (e.g., a high voltage) such that a transistor included in each of the pixels PX can be turned off. A transistor which is included in the pixel PX and receives the emission control signal may be turned off when the emission control signal is supplied, and be set to the turn-on state in other cases.

The emission control signal may be used to control an emission time of the pixels PX. The emission control signal may be set to have a time width, during which the emission control signal is activated, wider than a time width, during which the scan signal is activated, of the scan signal.

In some embodiments, during the one frame period, the emission control signal may include a plurality of gate-off level (e.g., the high voltage) periods.

The data driver DDR may receive the sixth driving control signal DCS and the image data RGB from the timing controller TCON. The data driver DDR may supply a data signal to the data lines DL, corresponding to the sixth driving control signal DCS. The data signal supplied to the data lines DL may be supplied to pixels PX selected by the scan signal (e.g., the first scan signal). The data driver DDR may supply the data signal to the data lines DL to be synchronized with the scan signal.

In some embodiments, the data driver DDR may supply the data signal to the data lines DL during the one frame period, corresponding to the image refresh rate. For example, the data driver DDR may supply the data signal to be synchronized with the scan signal supplied to the first scan lines SL1.

Figure 6A:
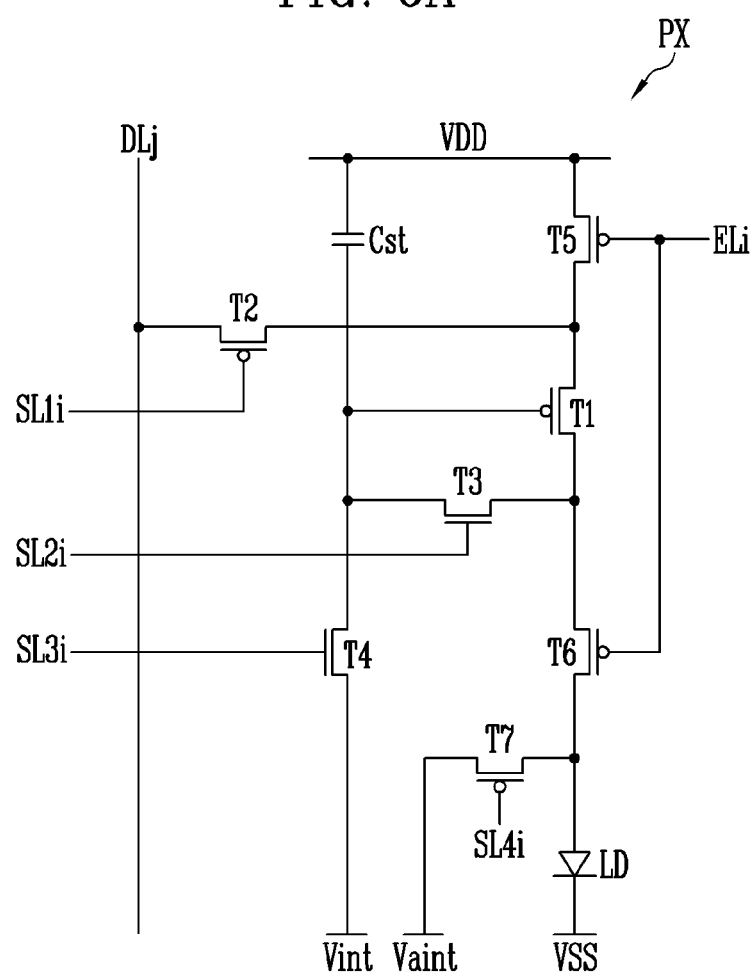
FIG. 6A is a diagram illustrating a pixel in accordance with an embodiment of the present invention.
Figure 6B:
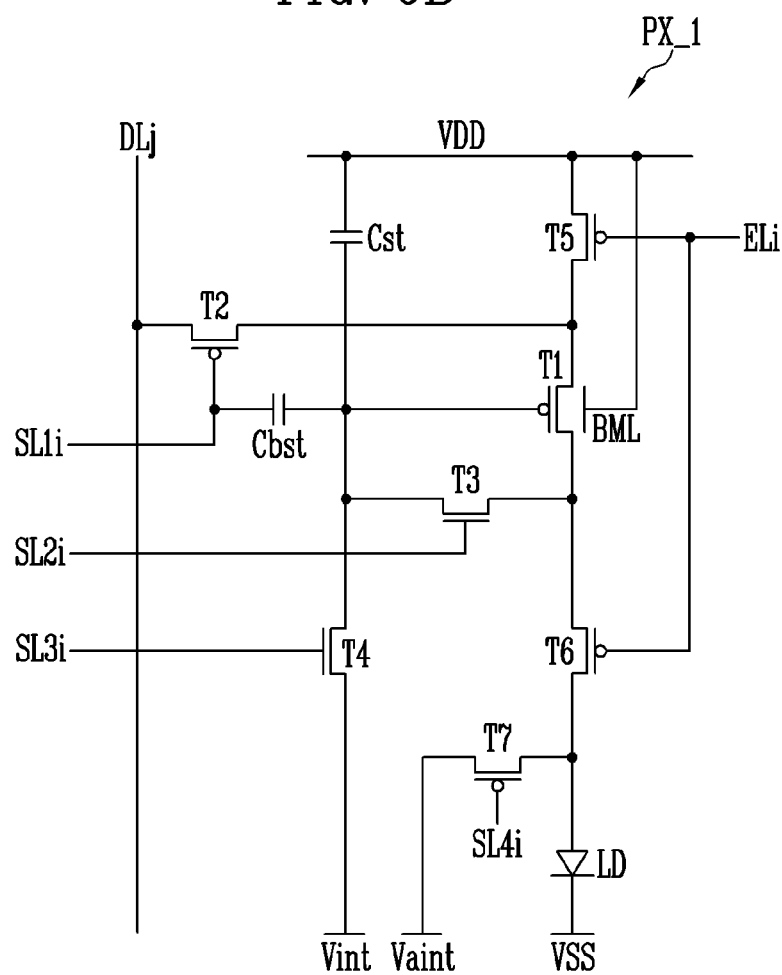
FIG. 6B is a diagram illustrating a pixel in accordance with an embodiment of the present invention.

FIG. 6A is a diagram illustrating a pixel in accordance with an embodiment of the present invention. FIG. 6B is a diagram illustrating a pixel in accordance with an embodiment of the present invention.

Referring to FIG. 6A, the pixel PX in accordance with the embodiment of the present invention may include transistors T1, T2, T3, T4, T5, T6, and T7, a storage capacitor Cst, and a light emitting element LD.

A first transistor T1 may be connected between the first power source VDD and the light emitting element LD. For example, a first electrode of the first transistor T1 may be connected to a second electrode of a second transistor T2, a second electrode of the first transistor T1 may be connected to a second electrode of a third transistor T3, and a gate electrode of the first transistor T1 may be connected to a first electrode of the third transistor T3. The first transistor T1 may be referred to as a driving transistor.

The second transistor T2 may be connected between a data line DLj and the first electrode of the first transistor T1. For example, a first electrode of the second transistor T2 may be connected to the data line DLj, the second electrode of the second transistor T2 may be connected to the first electrode of the first transistor T1, and a gate electrode of the second transistor T2 may be connected to a first scan line SL1i (or write gate line). The second transistor T2 may be referred to a gate transistor.

The third transistor T3 may be connected between the gate electrode of the first transistor T1 and the second electrode of the first transistor T1. For example, the first electrode of the third transistor T3 may be connected to the gate electrode of the first transistor T1, the second electrode of the third transistor T3 may be connected to the second electrode of the first transistor T1, and a gate electrode of the third transistor T3 may be connected to a second scan line SL2i (or compensation gate line). The third transistor T3 may be referred to as a diode connection transistor.

A fourth transistor T4 may be connected between the gate electrode of the first transistor T1 and the third power source Vint. For example, a first electrode of the fourth transistor T4 may be connected to the gate electrode of the first transistor T1 (or a second electrode of the storage capacitor Cst), a second electrode of the fourth transistor T4 may be connected to the third power source Vint, and a gate electrode of the fourth transistor T4 may be a third scan line SL3i (or initialization gate line). The fourth transistor T4 may be referred to as a gate initialization transistor. The gate electrode of the fourth transistor T4 may be connected to a previous second scan line. For example, a second scan signal supplied to the second scan line S2i may be a signal shifted by eight horizontal cycles from a second scan signal (i.e., a third scan signal (SL3i)) supplied to the previous scan line.

A fifth transistor T5 may be connected between the first power source VDD and the first electrode of the first transistor T1. For example, a first electrode of the fifth transistor T5 may be connected to the first power source VDD, a second electrode of the fifth transistor T5 may be connected to the first electrode of the first transistor T1, and a gate electrode of the fifth transistor T5 may be connected to an emission control line ELi (or emission gate line). The fifth transistor T5 may be referred to as a first emission transistor.

A sixth transistor T6 may be connected between the second electrode of the first transistor T1 and an anode of the light emitting element LD. For example, a first electrode of the sixth transistor T6 may be connected to the second electrode of the first transistor T1, a second electrode of the sixth transistor T6 may be connected to the anode of the light emitting element LD, and a gate electrode of the sixth transistor T6 may be connected to the emission control line ELi (or emission gate line). The sixth transistor T6 may be referred to as a second emission transistor.

A seventh transistor T7 may be connected between the fourth power source Vaint and the anode of the light emitting element LD. For example, a first electrode of the seventh transistor T7 may be connected to the fourth power source Vaint, a second electrode of the seventh transistor T7 may be connected to the anode of the light emitting element LD (or the second electrode of the sixth transistor T6), and a gate electrode of the seventh transistor T7 may be connected to a fourth scan line SL4i (or bypass gate line). The seventh transistor T7 may be referred to as an anode initialization transistor. The gate electrode of the seventh transistor T7 may be connected to a previous first scan line. For example, a first scan signal supplied to the first scan line SL1i may be a signal shifted by one horizontal cycle from a first scan signal (i.e., a fourth scan signal (SL4i)) supplied to the previous first scan line. However, this is merely illustrative, and the previous first scan line is not limited thereto.

A first electrode of the storage capacitor Cst may be connected to the first power source VDD, and the second electrode of the storage capacitor Cst may be connected to the gate electrode of the first transistor T1.

The anode of the light emitting element LD may be connected to the second electrode of the sixth transistor T6 (or the second electrode of the seventh transistor T7), and a cathode of the light emitting element LD may be connected to the second power source VSS. A voltage applied to the second power source VSS may be set lower than a voltage applied to the first power source VDD. The light emitting element LD may be an organic light emitting diode, an inorganic light emitting element, a quantum dot light emitting diode, or the like.

Each of the first transistor T1, the second transistor T2, the fifth transistor T5, the sixth transistor T6, and the seventh transistor T7 may be a P-type transistor. A channel of each of the first transistor T1, the second transistor T2, the fifth transistor T5, the sixth transistor T6, and the seventh transistor T7 may be configured with poly-silicon. A poly-silicon transistor may be a Low Temperature Poly-Silicon (LTPS) transistor. The poly-silicon transistor has a high electron mobility and has a fast driving characteristic according to the high electron mobility.

Each of the third transistor T3 and the fourth transistor T4 may be an N-type transistor. A channel of each the third transistor T3 and the fourth transistor T4 may be configured with an oxide semiconductor. An oxide semiconductor transistor can be formed through a low temperature process, and have a charge mobility lower than a charge mobility of the poly-silicon semiconductor transistor. Thus, a leakage current amount of oxide semiconductor transistors, which occurs in a turn-off state, is small as compared with poly-silicon transistors.

In some embodiments, the seventh transistor T7 may be configured as an N-type oxide semiconductor transistor instead of the poly-silicon transistor.

The embodiment shown in FIG. 6B is different from the embodiment shown in FIG. 6A, in that a pixel PX_1 further includes a boost capacitor Cbst between the gate electrode of the second transistor T2 and the second electrode of the storage capacitor Cst, and the first transistor T1 further includes a bottom metal electrode BML to which a static voltage is applied. The other components and a driving method of the embodiment shown in FIG. 6B are substantially identical to those of the embodiment shown in FIG. 6A. Hereinafter, overlapping descriptions of the same components will be omitted, and portions different from the embodiment shown in FIG. 6A will be mainly described.

In accordance with an embodiment, a boost capacitor Cbst may be further included between the gate electrode of the second transistor T2 and the second electrode of the storage capacitor Cst. Accordingly, when the first scan signal having a gate-off voltage (e.g., a high voltage) is supplied to the first scan line SL1i, a voltage applied to the storage capacitor Cst may be boosted by coupling of the boost capacitor Cbst. Accordingly, an effect that a black grayscale voltage of the P-type first transistor T1 is secured can be expected. For example, although a data voltage lower than a data voltage corresponding to a target black grayscale is applied through the data line DLj, the data voltage is boosted by the boost capacitor Cbst. Thus, the target block grayscale can be achieved, and accordingly, power consumption can be reduced.

In accordance with an embodiment, the first transistor T1 may further include a bottom metal electrode BML to which a static voltage (i.e., a constant voltage) is applied. For example, the static voltage applied to the bottom metal electrode BML may be first power source VDD. Accordingly, a threshold voltage of the first transistor T1 as the P-type transistor is moved in a negative direction. Hence, a leakage current flowing through the first transistor T1 (i.e., a sub-threshold leakage current) decreases, and thus occurrence of an afterimage in the display device 1000 (see FIG. 1) can be reduced.

Figure 7B:
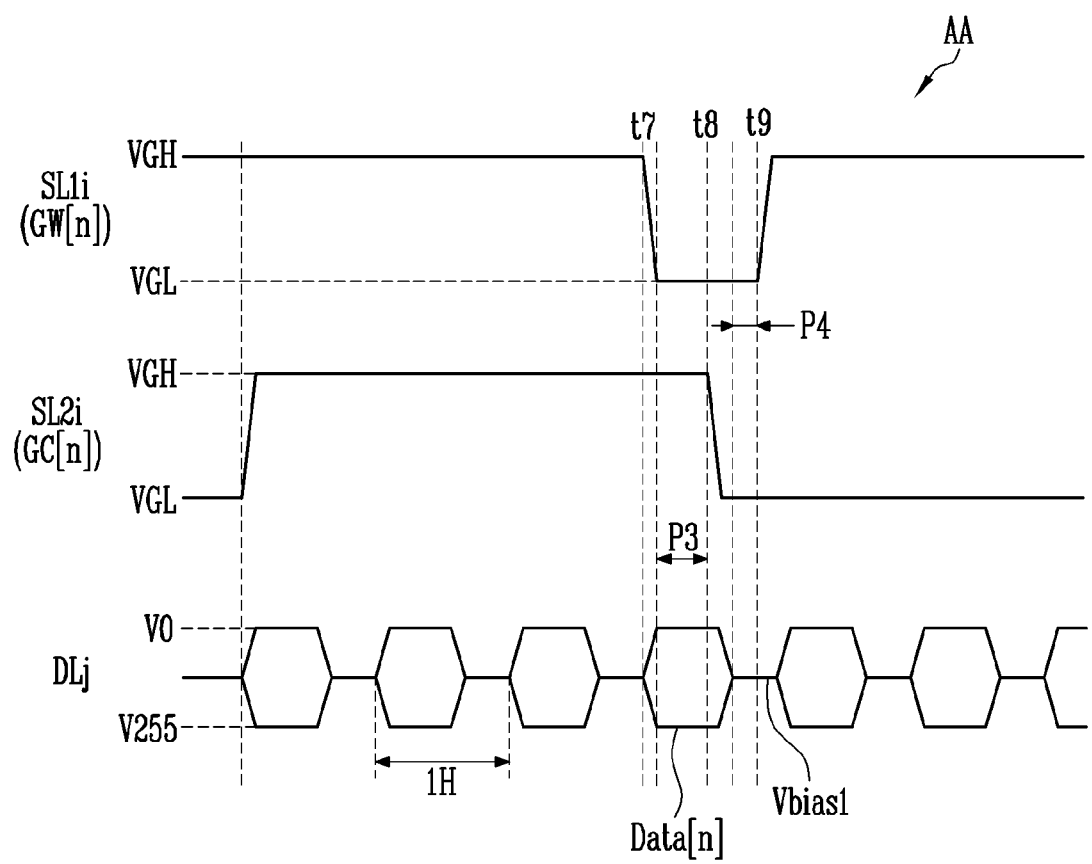
FIG. 7B is an enlarged waveform diagram of area AA shown in FIG. 7A.
Figure 7C:
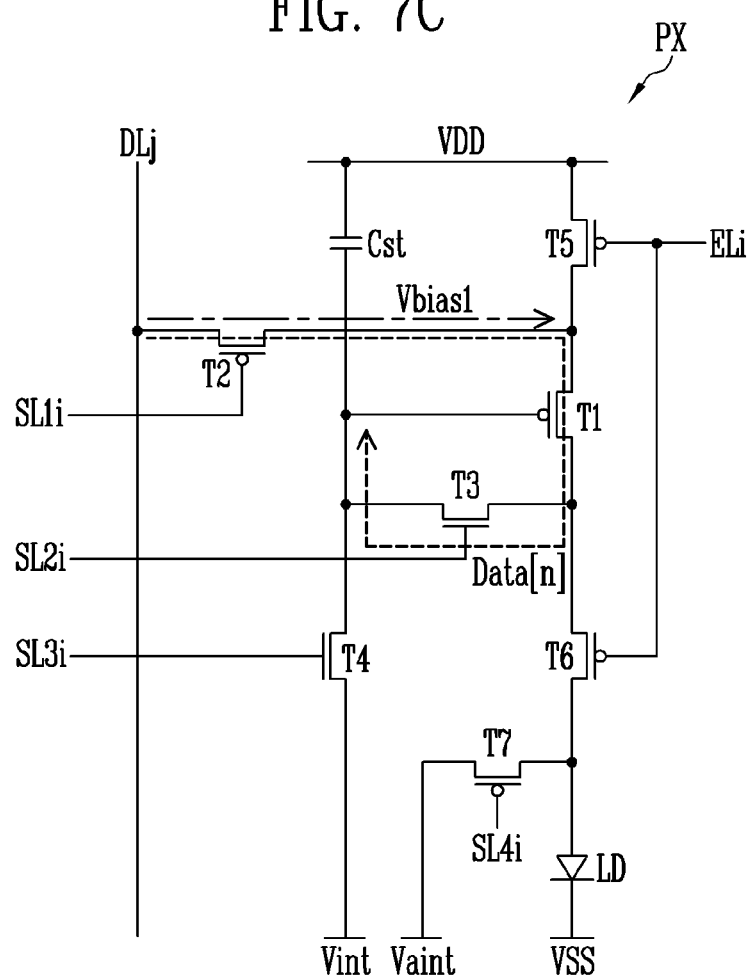
FIG. 7C is a diagram illustrating flow of a data signal supplied during a threshold voltage compensation and data writing period and an on-bias period in accordance with an embodiment of the present invention.

FIG. 7A is a waveform diagram illustrating a display scan period in accordance with an embodiment of the present invention. FIG. 7B is an enlarged waveform diagram of area AA shown in FIG. 7A. FIG. 7C is a diagram illustrating flow of a data signal supplied during a threshold voltage compensation and data writing period and an on-bias period. The threshold voltage compensation and data writing period corresponds to a third period P3 shown in FIG. 7B, and the on-bias period corresponds to a fourth period P4 shown in FIG. 7B.

Referring to FIGS. 6A to 7B, the pixel PX may be supplied with signals for image display during a display scan period DSP. The display scan period DSP may include a period in which a data signal Data[n] actually corresponding to an output image is written.

During the display scan period DSP, an emission control signal EM[n] may be supplied to the emission control line ELi, and a first scan signal GW[n], a second scan signal GC[n], a third scan signal GI[n], and a fourth scan signal GB[n] may be respectively supplied to the first to fourth scan lines SL1i, SL2i, SL3i, and SL4i.

First, from a first time t1 to a tenth time t10, the emission control signal EM[n] having a gate-off level (e.g., a high voltage VGH) may be supplied to the emission control line ELL Therefore, from the first time t1 to the tenth time t10, the fifth and sixth transistors T5 and T6 may be in the turn-off state.

During a first period P1 from a second time t2 to a third time t3, the third scan signal GI[n] having a gate-on level (e.g., the high voltage VGH) may be supplied to the third scan line SL3i. For example, the third scan signal GI[n] may be changed from a gate-off level (e.g., a low voltage VGL) to the gate-on level at the second time t2, and be maintained at the gate-on level until the third time t3. Accordingly, during the first period P1, the fourth transistor T4 may be turned on, so that the gate electrode of the first transistor T1 is initialized to the voltage of the initialization power source Vint and the voltage of the initialization power source Vint is maintained by the storage capacitor Cst. The first period P1 may be an initialization period (or first initialization period) of the first transistor T1.

At a fourth time t4, the second scan signal GC[n] may be changed from the gate-off level (e.g., the low voltage VGL) to the gate-on level (e.g., the high voltage VGH). Accordingly, at the fourth time t4, the third transistor T3 may be turned on.

During a second period P2 from a fifth time t5 to a sixth time t6, the fourth scan signal GB[n] having a gate-on level (e.g., a low voltage VGL) may be supplied to the fourth scan line SL4. For example, the fourth scan signal GB[n] may be changed from the gate-off level to the gate-on level (e.g., the low voltage VGL) at the fifth time t5, and be maintained at the gate-on level until the sixth time t6. Accordingly, during the second period P2, the seventh transistor T7 may be turned on, so that the voltage of the anode initialization power source Vaint is supplied to the anode of the light emitting element LD. The second period P2 may be an initialization period (or second initialization period) of the light emitting element LD.

At a seventh time t7, the first scan signal GW[n] may be changed from the gate-off level (e.g., the high voltage VGH) to the gate-on level (e.g., the low voltage VGL). Accordingly, at the seventh time t7, the second transistor T2 may be turned on.

At an eighth time t8, the second scan signal GC[n] may be changed from the gate-on level (e.g., the high voltage VGH) to the gate-off level (e.g., the low voltage VGL). Accordingly, at the eighth time t8, the third transistor T3 may be turned off.

At a ninth time t9, the first scan signal GW[n] may be changed from the gate-on level (e.g., the low voltage VGL) to the gate-off level (e.g., the high voltage VGH). Accordingly, at the ninth time t9, the second transistor T2 may be turned off.

Referring to FIG. 7B, a voltage provided through the data line DLj may repeat a change from a data voltage Data[n] to a first on-bias voltage Vbias1 in a predetermined unit (i.e., in a time unit). The predetermined unit may be one horizontal cycle 1H.

During a third period P3 from the seventh time t7 to the eighth time t8, the first scan signal GW[n] having the gate-on level may be provided to the first scan line SL1i, and the second scan signal GC[n] having the gate-on level may be provided to the second scan line SL2i, so that the second transistor T2 and the third transistor T3 are in the turn-on state.

For example, during the third period P3, the second scan signal GC[n] is maintained at the gate-on level, and hence the third transistor T3 may maintain the turn-on state. Accordingly, the first transistor T1 may have a diode-connected form.

During the third period P3, the first scan signal GW[n] is maintained at the gate-on level, and hence the second transistor T2 may be in the turn-on state. Therefore, during the third period P3, a data signal Data[n] corresponding to one of a grayscale value V0 to V255 of the pixel PX, which is applied to the data line DLj, may be written in the storage capacitor Cst via the second transistor T2, the first transistor T1, and the third transistor T3 as shown in FIG. 7C. The data signal Data[n] written in the storage capacitor Cst may be a voltage obtained by reflecting a decrement of the threshold voltage of the first transistor T1. The third period P3 may be the threshold voltage compensation and data writing period.

During a fourth period P4 from the eighth time t8 to the ninth time t9, the first scan signal GW[n] having the gate-on level (e.g., the low voltage VGL) may be provided to the first scan line SL1i, and the second scan signal GC[n] having the gate-off level (e.g., the low voltage VGL) may be provided to the second scan line SL2i, so that the second transistor T2 is in the turn-on state and the third transistor T3 is in the turn-off state.

For example, during the fourth period P4, the second scan signal GC[n] is maintained at the gate-off level (e.g., the low voltage VGL), and hence the third transistor T3 may be in the turn-off state. Accordingly, the second electrode (or drain electrode) and the gate electrode of the first transistor T1 may not be electrically connected to each other. During the fourth period P4, the first scan signal GW[n] is maintained at the gate-on level (e.g., the low voltage VGL), and hence the second transistor T2 may be in the turn-on state. Therefore, during the fourth period P4, the first on-bias voltage Vbias1 applied to the data line DLj may be applied to the first electrode (or source electrode) of the first transistor T1 through the second transistor T2 as shown in FIG. 7C. Accordingly, during the fourth period P4, the first transistor T1 may be maintained in an on-bias state. For example, the fourth period P4 may be an on-bias period.

Referring to FIG. 7A, at the tenth time t10, the emission control signal EM[n] may be changed from the gate-off level (e.g., the high voltage VGH) to the gate-on level (e.g., the low voltage VGL). Accordingly, the fifth and sixth transistors T5 and T6 are turned on, and therefore, the pixel PX (or the light emitting element LD) may emit light after the tenth time t10.

Figure 8:
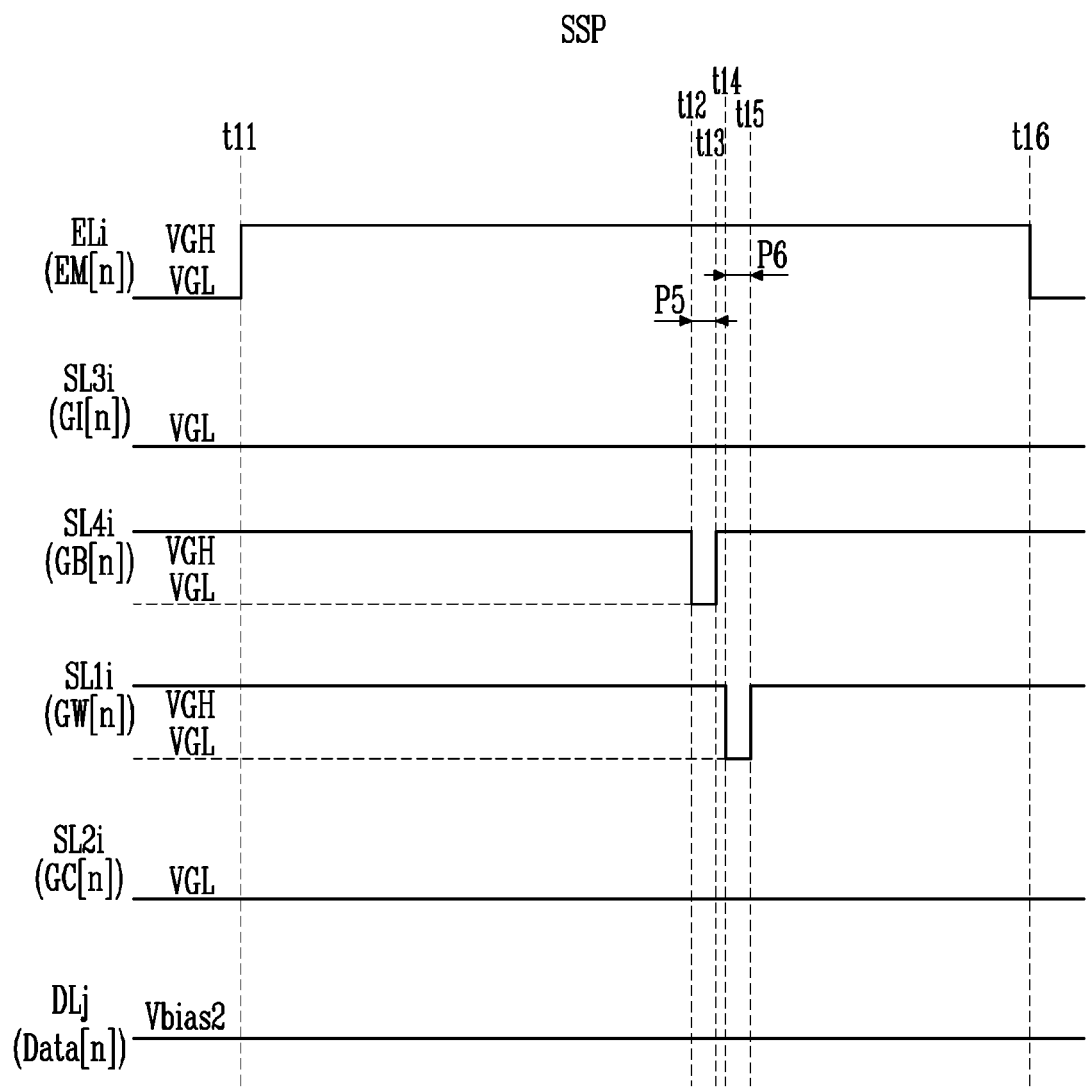
FIG. 8 is a waveform diagram illustrating a self-scan period in accordance with an embodiment of the present invention.

FIG. 8 is a waveform diagram illustrating a self-scan period in accordance with an embodiment of the present invention.

Referring to FIGS. 6A to 8, in the self-scan period SSP, any scan signal is not supplied to the third and fourth transistors T3 and T4. For example, in the self-scan period SSP, the second scan signal GC[n] and the third scan signal GI[n], which are respectively supplied to the second scan line SL2i and the third scan line SL3i, may have the gate-off level (e.g., the low voltage VGL).

In the self-scan period SSP, the first scan signal GW[n] and the fourth scan signal GB[n], which have the gate-on level (e.g., the low voltage VGL), may be supplied. In order to maintain a luminance of an image output in the display scan period DSP, in the self-scan period SSP, an on-bias voltage (or second on-bias voltage Vbias2) may be applied to the first electrode (or source electrode) of the first transistor T1. A magnitude of the second on-bias voltage Vbias2 may be different from a magnitude of the first on-bias voltage Vbias1. However, the present invention is not limited thereto, and the magnitude of the second on-bias voltage Vbias2 may be equal to the magnitude of the first on-bias voltage Vbias1.

First, from an eleventh time t11 to a sixteenth time t16, the emission control signal EM[n] having the gate-off level (e.g., the high voltage VGH) may be supplied to the emission control line ELi. Therefore, from the eleventh time t11 to the sixteenth time t16, the fifth and sixth transistors T5 and T6 may be in the turn-off state.

During a fifth period P5 from a twelfth time t12 to a thirteenth time t13, the fourth scan signal GB[n] having the gate-on level (e.g., the low voltage VGL) may be supplied to the fourth scan line SL4i. For example, the fourth scan signal GB[n] may be changed from the gate-off level to the gate-on level at the twelfth time t12, and be maintained at the gate-on level until the thirteenth time t13. Accordingly, during the fifth period P5, the seventh transistor T7 may be turned on, so that the voltage of the anode initialization power source Vaint may be supplied to the anode of the light emitting element LD. During the fifth period P5, the anode of the light emitting element LD may be initialized to the voltage of the anode initialization power source Vaint.

During a sixth period P6 from a fourteenth time t14 to a fifteenth time t15, the first scan signal GW[n] having the gate-on level (e.g., the low voltage VGL) may be supplied to the first scan line SL1i. For example, the first scan signal GW[n] may be changed from the gate-off level to the gate-on level at the fourteenth time t14, and be maintained at the gate-on level until the fifteenth time t15. Accordingly, during the sixth period P6, the second transistor T2 may be turned on. The second scan signal GC[n] is maintained at the gate-off level (e.g., the low voltage VGL), and hence the third transistor T3 may be in the turn-off state. Accordingly, the second electrode (or drain electrode) and the gate electrode of the first transistor T1 may not be electrically connected with each other. Therefore, during the sixth period P6, the second on-bias voltage Vbias2 applied to the data line DLj may be applied to the first electrode (or source electrode) of the first transistor T1 through the second transistor T2. Accordingly, during the sixth period P6, the first transistor T1 may be maintained in the on-bias state.

At the sixteenth time t16, the emission control signal EM[n] may be changed from the gate-off level (e.g., the high voltage VGH) to the gate-on level (e.g., the low voltage VGL). Accordingly, the fifth and sixth transistors T5 and T6 are turned on, and hence the pixel PX (or the light emitting element LD) may emit light after the sixteenth time t16.

In the self-scan period SSP, the data driver (DDR shown in FIG. 5) may not supply any data signal Data[n] to the pixel PX. Thus, power consumption can be further reduced.

Figure 9:
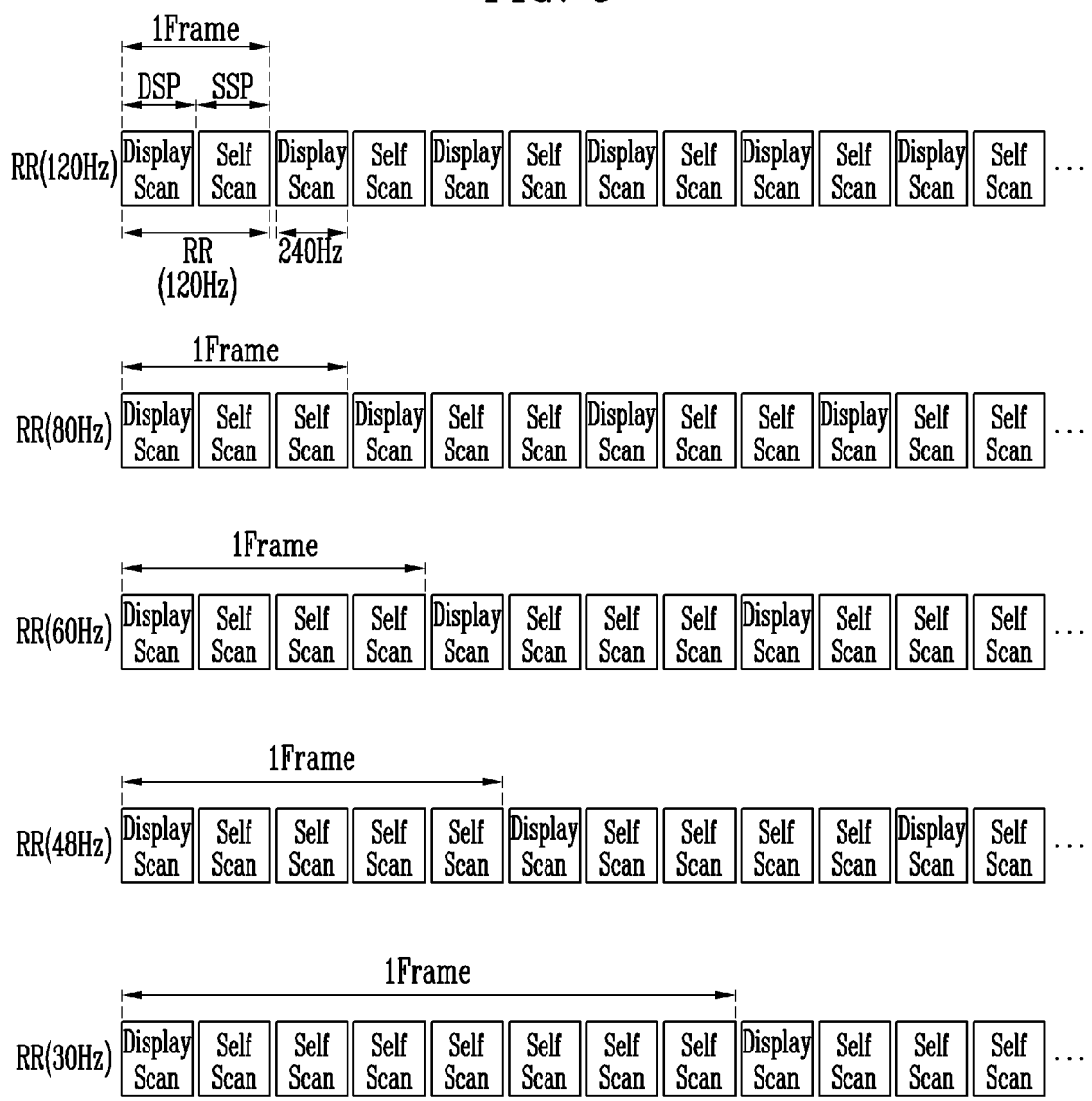
FIG. 9 is a conceptual diagram illustrating an example of a driving method of the display device according to an image refresh rate in accordance with an embodiment of the present invention.

FIG. 9 is a conceptual diagram illustrating an example of a driving method of the display device according to an image refresh rate.

Referring to FIGS. 5 to 9, the pixel PX may perform the operation shown in FIG. 7A in the display scan period DSP, and perform the operation shown in FIG. 8 in the self-scan period SSP.

In an embodiment, an output frequency of the second scan signal GC[n] and the third scan signal GI[n] may be changed according to an image refresh rate RR. For example, the second scan signal GC[n] and the third scan signal GI[n] may be output at the same frequency as the image refresh rate RR.

In an embodiment, the first scan signal GW[n], the fourth scan signal GB[n], and the emission control signals EM[n] may be output at a constant frequency regardless of the image refresh rate RR (i.e., different from the image refresh rate RR). For example, an output frequency of the first scan signal GW[n], the fourth scan signal GB[n], and the emission control signals EM[n] may be set to twice of a reference refresh rate (e.g., 120 Hz) of the display device 1000. The reference rate may correspond to a maximum image refresh rate that is allowed in a display device, and an image refresh rate may correspond to the maximum image refresh rate or another image refresh rate lower than the maximum image refresh rate.

In an embodiment, lengths of the display scan period DSP and the self-scan period SSP may be substantially equal to each other. However, a number of self-scan periods SSP included in one frame period may be determined according to the image refresh rate RR.

As shown in FIG. 9, when the display device 1000 is driven at an image refresh rate RR of 120 Hz, one frame period may include one display scan period DSP and one self-scan period SSP. Accordingly, the display device 1000 is driven at the image refresh rate RR of 120 Hz, each of the pixels PX may alternately repeat emission and non-emission twice during the one frame period.

In some embodiments, when the display device 1000 is driven at an image refresh rate RR of 80 Hz, one frame period may include one display scan period DSP and two consecutive self-scan periods SSR Accordingly, the display device 1000 is driven at the image refresh rate RR of 80 Hz, each of the pixels PX may alternately repeat emission and non-emission three times during the one frame period.

In a manner similar to the above, the display device 1000 adjusts a number of self-scan periods SSP included in one frame period, to be driven at a driving frequency of 60 Hz, 48 Hz, 30 Hz, or the like.

The number of self-scan periods SSP increases as the driving frequency decreases, so that an on-bias having a constant magnitude can be cyclically applied to the first transistor T1 included in each of the pixels PX. Thus, a luminance decrease, a flicker (blink), and screen attraction in low frequency driving can be reduced.

Figure 10A:
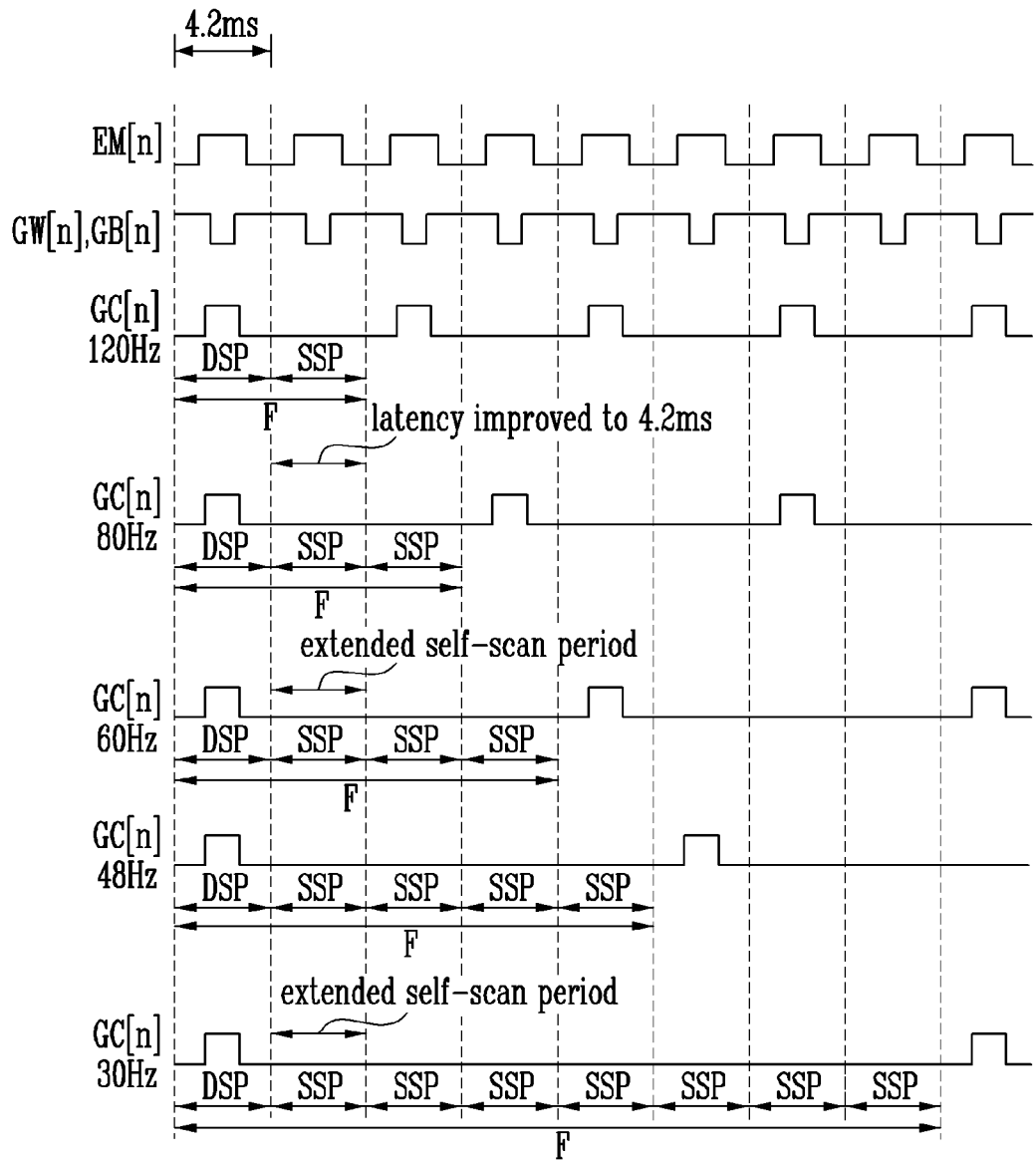

FIGS. 10A and 10B are diagrams illustrating an effect of a pixel driving method in accordance with an embodiment of the present invention.

Referring to FIGS. 9 and 10A, the display device 1000 in accordance with the embodiment of the present invention may provide, plural times (e.g., twice), the pixel PX with the first scan signal GW[n], the fourth scan signal GB[n], and the emission control signal EM[n] during one frame F, regardless of the image refresh rate RR.

For example, when the display device 1000 is driven at an image refresh rate RR of 120 Hz, the one frame F includes or is formed of one display scan period DSP and one self-scan period SSP, and hence an output frequency of the first scan signal GW[n], the fourth scan signal GB[n], and the emission control signal EM[n] may be 240 Hz. Therefore, each of the display scan period DSP and the self-scan period SSP may have a length of about 4.2 ms.

The touch sensor configured with the sensor unit 100 and the touch driver 300 has been described with reference to FIGS. 1 to 4. The display device 1000 in accordance with the embodiment of the present invention may be driven at a low image refresh rate RR, when an image displayed on the display panel 200 corresponds to a still image. In the display device 1000, when an external input (e.g., a touch of a user) is sensed during the self-scan period SSP, the self-scan period SSP may be changed to the display scan period DSP. A time taken when the self-scan period SSP is changed to the display scan period DSP due to an external input during the self-scan period SSP may be defined as latency. For example, maximum latency may correspond to the length of the self-scan period SSP. Therefore, the maximum latency of the display device 1000 in accordance with the embodiment of the present invention may be about 4.2 ms.

On the other hand, referring to FIG. 10B, when a conventional display device in which the first scan signal GW[n], the fourth scan signal GB[n], and the emission control signal EM[n] are provided to the pixel PX once during one frame period F' is driven an image refresh rate RR of 60 Hz, the one frame period F' includes or is formed of one display scan period DSP' and one self-scan period SSP', and hence an output frequency of the first scan signal GW[n], the fourth scan signal GB[n], and the emission control signal EM[n] may be 120 Hz. Therefore, each of the display scan period DSP' and the self-scan period SSP' may have a length of about 8.3 ms. For example, the maximum latency of the conventional display device may be 8.3 ms.

For example, when an Internet browser application is being executed in the display device 1000, a still image is displayed on the display panel 200, and therefore, the display device 1000 may be driven at a low image refresh rate RR, when any separate input is not provided from a user. When the user provides an external input such as scrolling to the display panel 200 so as to view a next page, the self-scan period SSP may be changed to the display scan period DSP. A time taken when the next page is displayed on the display panel 200 may be in proportion to the latency. Thus, the display device 1000 in accordance with the embodiment of the present invention can decrease the latency in half, as compared with the conventional display device.

Since the output frequency of the first scan signal GW[n], the fourth scan signal GB[n], and the emission control signal EM[n] is 240 Hz, the display device 1000 in accordance with the embodiment of the present invention can be driven at image refresh rates RR of 80 Hz and 48 Hz. However, since the output frequency of the first scan signal GW[n], the fourth scan signal GB[n], and the emission control signal EM[n] is 120 Hz, the conventional display device cannot be driven at the image refresh rates RR of 80 Hz and 48 Hz.

A case where the display device 1000 in accordance with the embodiment of the present invention is driven at image refresh rates of 60 Hz and 30 Hz will be described. A length of a total self-scan period SSP included in one frame period can increase as compared with a total self-scan period SSP' of the conventional display device. Accordingly, an effect that the power consumption of the display device 1000 is further reduced can be expected.

In the display device in accordance with the present invention, a voltage provided to a data line during one horizontal cycle is time-divided into a data voltage and an on-bias voltage to be provided, so that latency can be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel comprising:
   a light emitting element;
   a first transistor connected between a first power source and the light emitting element;
   a second transistor connected between a data line and a first electrode of the first transistor, the second transistor including a gate electrode connected to a first scan line;
   a third transistor connected between a gate electrode of the first transistor and a second electrode of the first transistor, the third transistor including a gate electrode connected to a second scan line;
   a fourth transistor connected between the gate electrode of the first transistor and an initialization power source, the fourth transistor including a gate electrode connected to a third scan line; and
   a storage capacitor connected between the first power source and the gate electrode of the first transistor,
   wherein a voltage provided through the data line is time divided into a data voltage provided to the gate electrode of the first transistor when both the second transistor and the third transistor are turned on, and an on-bias voltage provided to the first electrode of the first transistor when the second transistor is turned on and the third transistor is turned off,
   wherein the second transistor is turned on by a first scan signal, wherein the third transistor is turned on by a second scan signal, and wherein a falling edge of the second scan signal is between a falling edge of the first scan signal and a rising edge of the first scan signal and overlaps a supply period of the first scan signal between the falling and rising edges of the first scan signal.

2. The pixel of claim 1,
wherein the voltage provided through the data line is repeatedly changed from the data voltage to the on-bias voltage in a time unit.

3. The pixel of claim 2,
wherein the time unit is one horizontal cycle.

4. The pixel of claim 1,
wherein the data voltage has a plurality of voltage levels corresponding to a plurality of grayscale values, and
wherein the on-bias voltage is a constant voltage.

5. The pixel of claim 1, further comprising:
a fifth transistor connected between the first power source and the first electrode of the first transistor;
a sixth transistor connected between the second electrode of the first transistor and an anode of the light emitting element; and
a seventh transistor connected between an anode initialization power source and the anode of the light emitting element.

6. The pixel of claim 5,
wherein the fourth transistor is turned on by a third scan signal,
wherein the fifth transistor is turned off by an emission control signal,
wherein the sixth transistor is turned off by the emission control signal, and
wherein the seventh transistor is turned on by a fourth scan signal.

7. The pixel of claim 6,
wherein the second scan signal and the third scan signal are output at a frequency equal to an image refresh rate.

8. The pixel of claim 6,
wherein the first scan signal, the fourth scan signal, and the emission control signal are output at a frequency different from an image refresh rate that is equal to or smaller than a reference refresh rate.

9. The pixel of claim 8,
wherein the reference refresh rate is a maximum refresh rate, and
wherein the frequency is twice of the reference refresh rate.

10. The pixel of claim 9,
wherein the reference refresh rate is 120 Hz.

11. The pixel of claim 6,
wherein the third scan signal is supplied before the first scan signal and the second scan signal are supplied.

12. The pixel of claim 6,
wherein the first scan signal is a signal shifted by one horizontal cycle from the fourth scan signal.

13. The pixel of claim 1,
wherein each of the third transistor and the fourth transistor is an N-type transistor.

14. The pixel of claim 1, further comprising:
a boost capacitor between the gate electrode of the second transistor and one end of the storage capacitor.

15. The pixel of claim 1,
wherein the first transistor further includes a bottom metal electrode directly connected to the first power source.

16. A display device comprising:
a display panel including a pixel connected to a data line, the display panel operating at a variable driving frequency; and
a touch sensor disposed on the display panel,
wherein one frame period includes one display scan period and at least one self-scan period,
wherein, during the at least one self-scan period, the display panel is changed to a display scan period when a touch input is sensed through the touch sensor,
wherein a voltage provided through the data line is repeatedly changed in the display scan period including two or more time units and is supplied alternately as a data signal of a data voltage and a bias signal of a first on-bias voltage during the display scan period having a plurality of time units, and
wherein each time unit of the two or more time units has one data voltage signal and the bias signal.

17. The display device of claim 16,
wherein the data voltage has a plurality of voltage levels corresponding to a plurality of grayscale values, and
wherein the first on-bias voltage is a constant voltage.

18. The display device of claim 16,
wherein the voltage provided through the data line is a second on-bias voltage different from the first on-bias voltage during the at least one self-scan period.

19. The display device of claim 16, wherein the pixel includes:
a light emitting element;
a first transistor connected between a first power source and the light emitting element;
a second transistor connected between the data line and a first electrode of the first transistor, the second transistor including a gate electrode connected to a first scan line;
a third transistor connected between a gate electrode of the first transistor and a second electrode of the first transistor, the third transistor including a gate electrode connected to a second scan line;
a fourth transistor connected between the gate electrode of the first transistor and an initialization power source, the fourth transistor including a gate electrode connected to a third scan line; and
a storage capacitor connected between the first power source and the gate electrode of the first transistor.

20. The display device of claim 19,
wherein, in the display scan period, the data voltage is provided to the gate electrode of the first transistor when both the second transistor and the third transistor are turned on, and the first on-bias voltage is provided to the first electrode of the first transistor when the second transistor is turned on and the third transistor is turned off.

* * * * *